United States Patent
Gardner et al.

(10) Patent No.: US 6,200,865 B1
(45) Date of Patent: Mar. 13, 2001

(54) USE OF SACRIFICIAL DIELECTRIC STRUCTURE TO FORM SEMICONDUCTOR DEVICE WITH A SELF-ALIGNED THRESHOLD ADJUST AND OVERLYING LOW-RESISTANCE GATE

(75) Inventors: Mark I. Gardner, Cedar Creek; H. Jim Fulford, Jr., Austin, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/205,443

(22) Filed: Dec. 4, 1998

(51) Int. Cl.[7] ................................................ H01L 21/336
(52) U.S. Cl. ..................... 438/291; 438/197; 438/692; 438/585; 438/595; 438/719; 438/735
(58) Field of Search ..................... 438/692, 719, 438/735, 197, 595, 585

(56) References Cited

U.S. PATENT DOCUMENTS

| | | | |
|---|---|---|---|
| 3,528,168 | * | 9/1970 | Adamic, Jr. . |
| 5,391,510 | * | 2/1995 | Hsu et al. . |
| 5,576,227 | * | 11/1996 | Hsu . |
| 5,712,503 | | 1/1998 | Kim et al. . |
| 5,744,845 | * | 4/1998 | Sayama et al. . |
| 5,940,698 | * | 8/1999 | Gardner et al. . |
| 5,998,286 | * | 12/1999 | Chen et al. . |
| 5,998,288 | | 12/1999 | Gardner et al. . |
| 6,004,850 | | 12/1999 | Lucas et al. . |
| 6,022,795 | * | 2/2000 | Chen et al. . |
| 6,043,157 | * | 3/2000 | Gardner et al. . |
| 6,051,487 | * | 4/2000 | Gardner et al. . |

* cited by examiner

*Primary Examiner*—Richard Booth
*Assistant Examiner*—Jonathan Hack
(74) *Attorney, Agent, or Firm*—Kevin L. Daffer; Coley, Rose & Tayon

(57) ABSTRACT

A semiconductor device is provided and formed using self-aligned low-resistance gates within a metal-oxide semiconductor (MOS) process. A sacrificial dielectric gate structure is formed on a semiconductor substrate instead of a conventional gate dielectric/gate conductor stack. After forming junction regions within a semiconductor substrate, the gate structure is removed to form a trench within a dielectric formed above the substrate. A low-resistance gate material can then be arranged within the trench, i.e., in the region removed of the gate conductor. The gate material can take various forms, including a single layer or multiple metal and/or dielectric layers interposed throughout the as-filled trench. The gate formation occurs after high temperature cycles often associated with activating the previously implanted junctions or growing gate dielectrics. Thus, low-temperature metals such as copper or copper alloys can be used.

20 Claims, 6 Drawing Sheets

USE OF SACRIFICIAL DIELECTRIC STRUCTURE TO FORM SEMICONDUCTOR DEVICE WITH A SELF-ALIGNED THRESHOLD ADJUST AND OVERLYING LOW-RESISTANCE GATE

BACKGROUND OF THE INVENTION

1. Field of the Invention

This invention relates to integrated circuit fabrication, and more particularly, to a semiconductor device having a self-aligned low-resistance gate stricture and to a method for producing this device.

2. Description of the Relevant Art

The formation of self-aligned source and drain regions is a well-established technique in MOSFET fabrication. These source and drain regions exhibit minimal overlap with the transistor gate, minimizing the parasitic capacitances that limit high-frequency transistor performance. In general, the self-alignment is achieved by fabricating a gate conductor, and subsequently using the gate conductor as a mask for implantation of dopant impurities to form the source and drain. Because it is formed before the implantation and subsequent annealing of the source and drain impurities, the gate conductor must be made from a material which can withstand high-temperature processing.

The current material of choice for gate conductors in MOSFET fabrication is polycrystalline silicon, or polysilicon. Although polysilicon has good high-temperature properties, it has high resistivity compared to that of a metal. The resistance R of a material region can be defined in terms of the matcrial's resistivity, $\rho$, the region's cross-sectional area, A, and the region's length, l, using the equation $R = \rho l/A$. As features on integrated circuits become smaller, area A decreases, and it becomes more and more important for resistivity to be low in order to achieve low resistances. The resistivity of a polysilicon gate conductor is typically lowered by doping. The doping is often performed by ion implantation, using the same implants which dope the self-aligned source and drain.

Problems arise with this process, however, in part because of the different rates of dopant diffusion in polysilicon as opposed to single-crystal silicon. Although typical gate conductor thicknesses arc greater than the depths of the shallow junctions required for source and drain regions in high-performance devices, diffusion rates along the grain boundaries of polycrystalline films can be on the order of one hundred times as fast as in single-crystal silicon. This can allow dopants in a polysilicon gate conductor to diffuse across the thin gate oxide and into the underlying channel region during high-temperture processes such as implant anneals. Such diffusion can leave a region of low carrier concentration in the polysilicon directly above the gate oxide, an occurrence often called the "polysilicon depletion effect". This region of the gate conductor adjacent to the gate dielectric therefore has a higher resistivity, and the resulting device performs as if it had an increased gate dielectric thickness. Effective doping of polysilicon gate regions is further complicated in CMOS devices because of differences in diffusion behavior of boron, the typical p-channel transistor dopant, and arsenic, the typical n-channel transistor dopant. Boron diffuses more rapidly in polysilicon than arsenic, which tends to segregate at grain boundaries. Adequate activation of arsenic impurities throughout the gate conductor of an n-channel device without causing excessive boron diffusion and polysilicon depletion effects in a p-channel device presents significant challenges.

Another problem with self-aligned process in which gate conductors are formed prior to source/drain formation is that any impurity introduction into the channel region which may be needed, such as impurities for adjusting threshold voltage, must generally be introduced early in the fabrication process, and across the entire active area of the substrate. In order to be placed in the channel region, such impurities must be introduced before formation of the gate conductor, and restricting them to a particular region of the substrate would require an additional masking step, and the expense and chance for yield reduction associated with masking steps. Problems which may result from introducing channel-region impurities across the entire active area before gate conductor formation include electrical compensation of subsequently-formed source and drain regions, and unwanted migration of the channel-region impurities during subsequent high-temperature anneals, such as those typically used to activate source/drain impurity distributions.

A gate conductor made from a low-resistance metal would alleviate many of the problems with polysilicon gate conductors discussed above. Unfortunately, low-resistance metals such as aluminum are not able to withstand the high-temperature processing needed, for example, to anneal the as-implanted source and drain regions employed within a standard self-aligned process. It would therefore be desirable to develop a method of forming self-aligned gates using low-resistance metals or metal alloys. The desired method should further allow impurities to be introduced exclusively into the channel region of a transistor.

SUMMARY OF THE INVENTION

The problems outlined above are in large part addressed by a process in which a metal-containing self-aligned gate structure is formed after high-temperature processes such as the source and drain anneal cycles. One or more sacrificial dielectric gate structures are formed on a semiconductor substrate. Because the sacrificial gate structure will be removed during subsequent processing, etch selectivity to the gate structure over the underlying semiconductor is important. Use of a dielectric rather than other material such as polysilicon for the sacrificial gate structure may be advantageous by allowing improved selectivity over the underlying, silicon-based semiconductor substrate. A fabrication process similar to that typically used to form polysilicon-gate transistors is subsequently carried out using the sacrificial gate structure in place of a polysilicon gate. Self-aligned source and drain impurity introduction may be included in this fabrication, for example, and a salicide process may be performed on the transistors.

The sacrificial gate structure must be formed from a dielectric which can withstand the temperatures used in this fabrication process, such as the temperatures needed to anneal source and drain impurity implants, for example. Suitable dielectrics include silicon dioxide ("oxide"), silicon nitride ("nitride"), and silicon oxynitride ("oxynitride"). Dielectric spacers may be formed on sidewalls of the sacrificial gate structure as a part of the transistor fabrication process discussed above. If such spacers are formed, they must be formed from a different dielectric than that used to form the sacrificial gate structure, so that the gate structure may subsequently be removed without removing the spacers. For example, if oxide is used to form the sacrificial gate structure, nitride or oxynitride may be used to form the spacers. Alternatively, the gate structure may be formed from nitride or oxynitride, and the spacers from oxide.

Protective dielectrics are subsequently formed over the substrate and surrounding the sacrificial gate structures such that upper surfaces of the protective dielectrics are even with upper surfaces of the gate structures. In this way, all upper surfaces of the semiconductor topography except the upper surfaces of the gate structures are protected by dielectric. As in the case of the spacers described above, the protective dielectrics are formed from a different dielectric than that used to form the sacrificial gate structures. Each uncovered sacrificial gate structure is Subsequently removed by a self-aligned, selective etch process to produce a trench in place of the previously for med sacrificial date structure. A base of the trench comprises an upper surface of the underlying semiconductor substrate. Depending on the desired operating characteristics of the finalized device, this trench may subsequently be refilled with mate rial s including low-resistivity metals, dielectric layers, and/or polysilicon layers. Any material deposited external to the trench is subsequently removed, preferably using chemical-mechanical polishing, as in a damascene process.

The protective dielectrics or sidewall spacers formed adjacent to the original sacrificial gate structure may serve to define the dimensions of the new gate structure formed after the sacrificial gate structure is removed. In this manner, although the new gate structure is formed after the source and drain regions of the transistor, it may be self-aligned to them nonetheless. Because the new gate structure is formed after the high-temperature source and drain formation as well as after all high-temperature growth and/or anneal cycles, it may be formed from a low-temperature material such as aluminum or copper. Copper gate conduct or s may be particularly advantageous because of the low resistance of copper, and because such gate conductors may be easily integrable with low-resistance copper interconnect technologies.

After removal of the sacrificial gate structure , a gate dielectric is for med on the semiconduct or substrate at the bottom of the trench. The trench may then be filled with a conductive material to form a transistor. A threshold adjust implant may be performed after removal of the sacrificial gate structure, before or after formation of the gate dielectric. Because the source and drain regions of the transistor are protected by dielectric, this implant is directed only into the channel region. This may be advantageous as compared with conventional threshold adjust implants which are typically performed early in the transistor fabrication process and directed into the entire active region of the semiconductor substrate. For NMOS transistors, for example, threshold adjust implants are typically p-type. Confining the threshold adjust implant to the channel region avoids compensation of the n-type source and drain regions with p-type threshold adjust impurities, which may thereby avoid a decrease in carrier mobility of the source and drain regions.

In an alternative embodiment, the trench may be partially filled with a conductive material after formation of the gate dielectric, and a second gate dielectric may be formed over this conductive material. The remainder of the trench may be filled with a conductive material such that a dual gate memory cell (for example, an EEPROM) is formed. Using copper for the memory cell gates may be particularly advantageous, in that copper has a very high electron storage capacity as compared to polysilicon and other metals. Such a memory cell may be able to have a reduced area and retain an optimal program charge, comparable to that of a larger conventional, non-copper-gate device.

In addition to the process described above, a semiconductor device having a self-aligned metal-containing gate is contemplated herein. A gate structure, which includes a gate region and may include sidewall spacers, is arranged above an active region of a semiconductor substrate. A gate dielectric is interposed between the gate region and the active region, and a protective dielectric is arranged above the active region and adjacent to lateral surfaces of the gate structure. The gate region may include a metal layer, a polysilicon layer, and/or a dielectric layer. Embodiments of this device include a transistor having a self-aligned metal gate, and a dual-gate memory cell having metal upper and/or lower gates.

BRIEF DESCRIPTION OF THE DRAWINGS

Other objects and advantages of the invention will become apparent upon reading the following detailed description and upon reference to the accompanying drawings in which.

Figure 1:
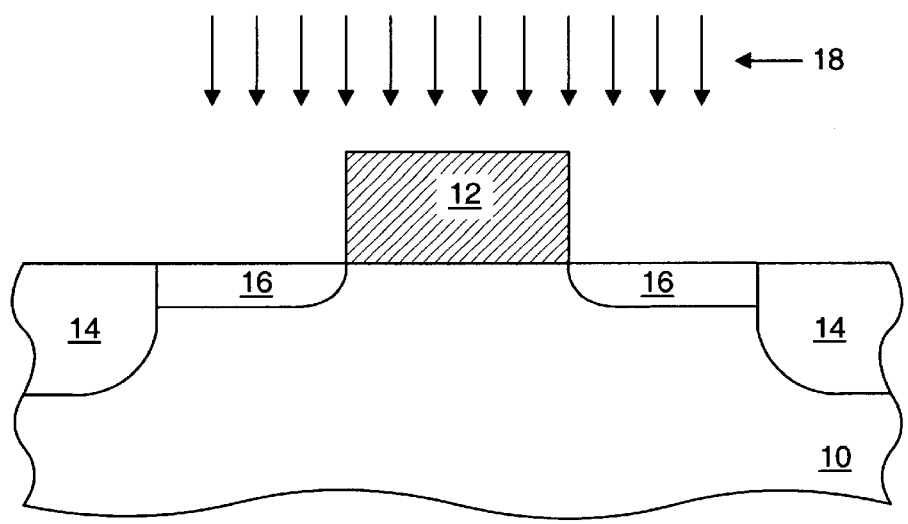
FIG. 1 is a partial cross-sectional view of a semiconductor topography including an active region within a semiconductor substrate upon which a sacrificial dielectric gate structure is formed and into which an impurity distribution is introduced.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Turning to the drawings, FIG. I illustrates a partial cross-section of a semiconductor topography including dielectric sacrificial gate structure 12 formed on semiconductor substrate 10, according to an embodiment of the process recited herein. Isolation regions 14 may be formed within substrate 10 in order to electrically isolate the subsequently-formed device from adjacent devices. Impurity distributions 16 may be introduced and electrically activated (annealed) within substrate 10, self-aligned to sacrificial gate structure 12. Impurity introduction process 18, preferably an ion implantation, is used to introduce distributions 16.

Semiconductor substrate 10 is preferably monocrystalline silicon, and is doped either n-type or p-type. Substrate 10 may, for example, be an epitaxial silicon layer grown on a monocrystalline silicon substrate, or an n-type or p-type well region formed in a monocrystalline silicon substrate. Alternatively, substrate 10 may be an epitaxial silicon layer formed upon an insulating layer on a semiconductor substrate. Isolation regions 14 may be formed by methods well known in the art. One such method is the formation of trenches which are subsequently filled with a deposited dielectric, while another method which may be used is local oxidation of the substrate, using silicon nitride to mask the active regions.

Sacrificial gate structure 12 is formed from a dielectric material capable of withstanding the temperatures needed for subsequent device processing (such as that needed to form source and drain regions). Suitable dielectrics include oxide, nitride, and oxynitride. For the purposes of this application, "oxynitride" refers to dielectrics formed from silicon, oxygen, and nitrogen, and includes, for example, nitrided oxides. Ways in which such a dielectric may be formed include deposition using precursors containing silicon, oxygen and nitrogen, or annealing of an oxide in a nitrogen-bearing ambient. Sacrificial gate structure 12 is preferably patterned from a dielectric layer which is deposited using chemical vapor deposition (CVD). Suitable deposition methods may include low-pressure CVD (LPCVD), plasma-enhanced CVD (PECVD), and atmospheric-pressure CVD (APCVD). In embodiments for which gate structure 12 is formed from nitride, a thin pad oxide may be grown or deposited between gate structure 12 and substrate 10. Impurity distributions 16 are of opposite type to that of substrate 10. For an n-channel transistor, for example, substrate 10 is p-type and distributions 16 are n-type. Typical n-type dopants include arsenic and phosphorus, while boron is a typical p-type dopant. If impurity introduction 18, used to introduce source and drain impurity distributions 16, is an ion implantation process, a subsequent anneal is performed in order to activate the impurities and repair damage to substrate 10.

Figure 2:
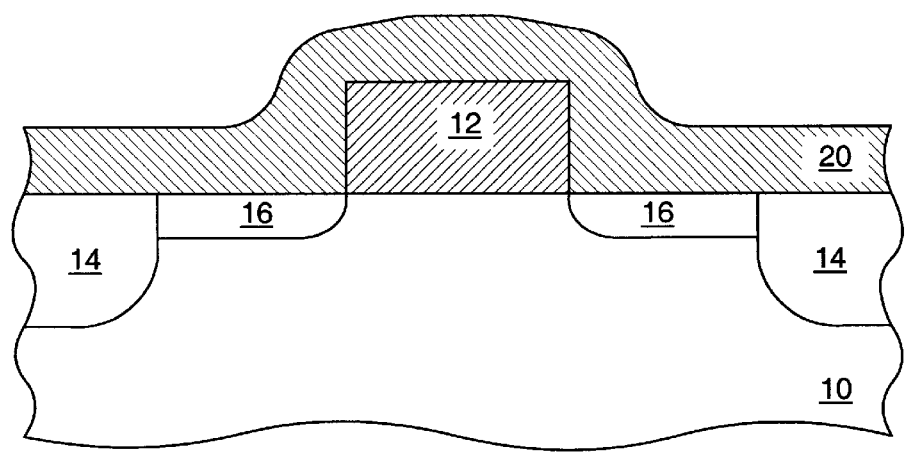
FIG. 2 is a partial cross-sectional view of the semiconductor topography wherein a conformal dielectric layer is deposited over the transistor, subsequent to the impurity introduction of FIG. 1.
Figure 3:
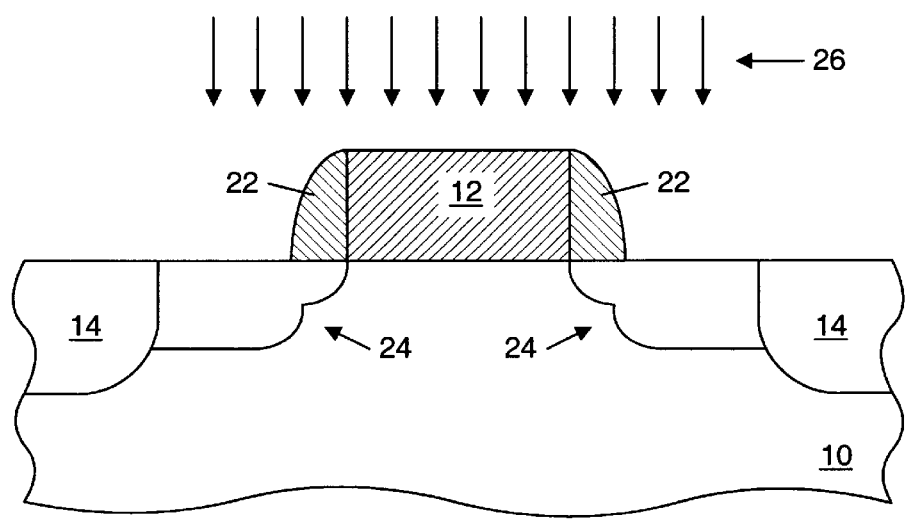
FIG. 3 is a partial cross-sectional view of the semiconductor topography wherein portions of the dielectric layer are removed such that dielectric spacers are formed and an additional impurity distribution is introduced to form source and drain regions, subsequent to the deposition of FIG. 2.

Dielectric layer 20 may be subsequently deposited over substrate 10 and sacrificial gate structure 12, as shown in FIG. 2. As in the case of gate structure 12, dielectric layer 20 is formed from a dielectric such as oxide, nitride, or oxynitride which can withstand elevated processing temperatures. Dielectric layer 20 must be formed from a different dielectric than that used to form gate structure 12, so that gate structure 12 may be subsequently removed without damage to the spacers which are formed from dielectric layer 20. For example, if sacrificial gate structure 12 is formed from oxide, dielectric layer 20 may be formed from nitride or oxynitride. In embodiments for which dielectric layer 20 is formed from nitride, a thin pad oxide may be deposited or grown prior to deposition of dielectric layer 20. This spacer formation, preferably using an anisotropic etch process, is shown in FIG. 3. Formation of spacers 22 may be advantageous for many reasons, including the ability to form lightly-doped drain (LDD) regions under the spacers which may lower the maximum electric field developed at the drain end of the channel. This lowered electric field may reduce the severity of hot-carrier effects such as avalanche breakdown at the drain/substrate junction and injection of carriers into the gate dielectric. An additional impurity introduction may be performed using impurity introduction process 26, self-aligned to gate structure 12 and spacers 22. Impurity introduction process 26, preferably an ion implantation process, may be used to introduce impurities of the same type as introduced by impurity introduction process 18 in FIG. 1. The impurity distributions resulting from impurity introduction 26, however, are typically more heavily doped than distributions 16 of FIG. 1, and extend farther into the substrate. The resulting source/drain regions 24 include LDD regions under spacers 22.

Figure 4:
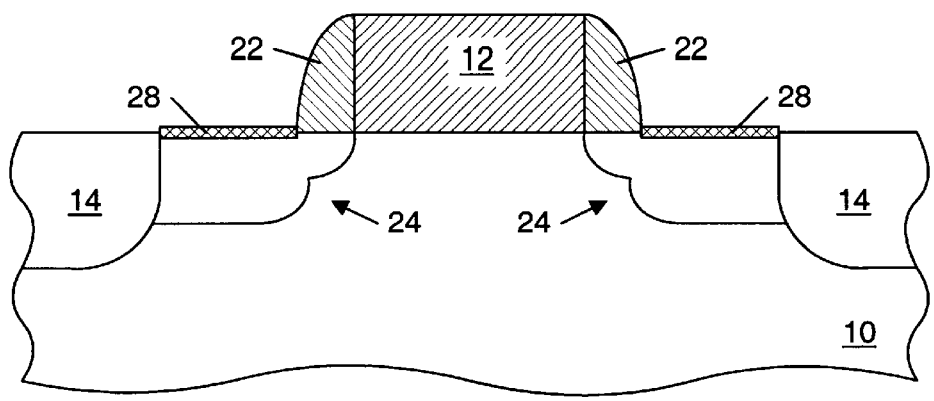
FIG. 4 is a partial cross-sectional view of the semiconductor topography wherein suicides are formed on upper surfaces of the source and drain regions, subsequent to the impurity introduction of FIG. 3.

Spacers such as spacers 22 may also be advantageous by providing isolation between the source/drain and gate regions so that a salicide process may be performed. In a salicide process, a metal film is blanket-deposited over the exposed surfaces of the transistor after formation of the source and drain regions. The transistor is then subjected to a heating process which causes a reaction between the metal and silicon that the metal is in contact with, forming a silicide on the silicon surfaces. Unreacted metal is then removed, leaving the suicide covering the gate, source, and drain regions. Such a process may be used to form source/drain silicides 28, shown in FIG. 4. Because sacrificial gate structure 12 is formed from dielectric rather than silicon, no gate silicide is formed.

Figure 5:
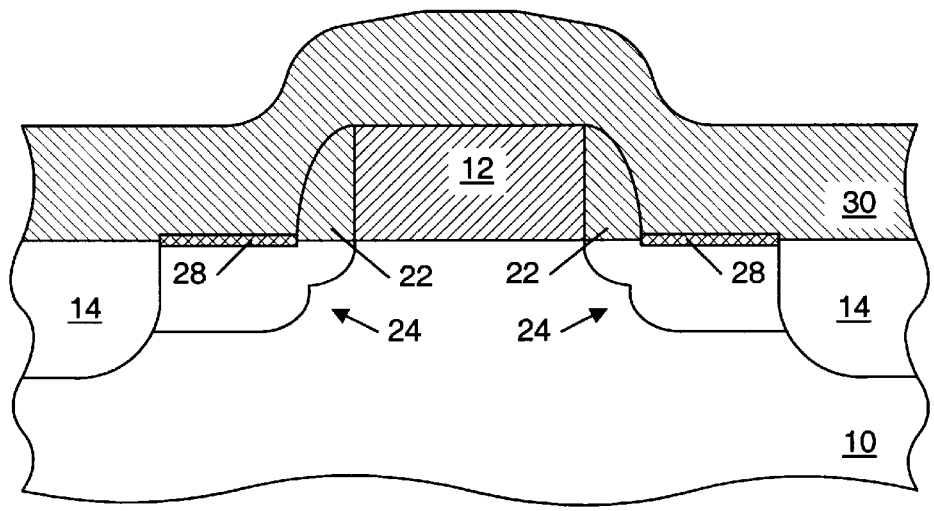
FIG. 5 is a partial cross-sectional view of the semiconductor topography wherein a thick conformal dielectric layer is deposited over the sacrificial gate structure and the semiconductor substrate, subsequent to the silicide formation of FIG. 4.

Turning now to FIG. 5, conformal dielectric layer 30 is deposited over semiconductor substrate 10 and sacrificial gate structure 12. Unlike gate structure 12 and spacers 22, dielectric layer 30 does not particularly need to be formed from a dielectric which can withstand elevated processing temperatures, since the high-temperature processing associated with forming source and drain regions has been completed. Dielectrics such as oxide, nitride, or oxynitride are suitable choices for dielectric layer 30 nonetheless. As in the case of dielectric layer 20 in FIG. 2, dielectric layer 30 must be formed from a different dielectric than that used to form gate structure 12, so that gate structure 12 may be subsequently removed without damage to the protective dielectrics which are formed from dielectric layer 30. Dielectric layers 20 and 30 may be formed from the same dielectric. Dielectric layer 30 is at least as thick as gate structure 12, and is preferably deposited using a CVD technique. For example, if dielectric layer 30 is formed from oxide (gate structure 12 would need to be formed from a different dielectric, such as nitride or oxynitride, in this case), decomposition of tetraethyl orthosilicate (TEOS) may be performed in an LPCVD reactor at a substrate temperature in the range from about 400° C. to about 800° C. to produce a very conformal film. As in the case of dielectric layer 20 and gate structure 12, a thin pad oxide may be included if dielectric layer 30 is formed from nitride.

Figure 6:
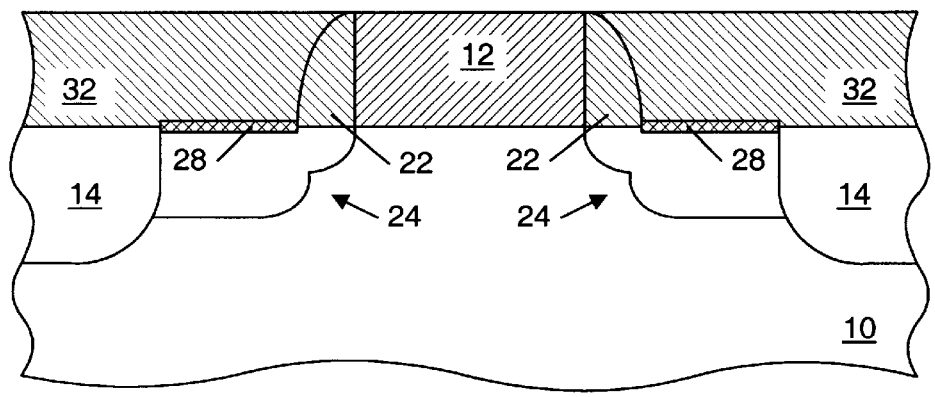
FIG. 6 is a partial cross-sectional view of the semiconductor topography wherein portions of the dielectric layer are removed such that protective dielectrics are formed, subsequent to the deposition of FIG. 5.
Figure 7:
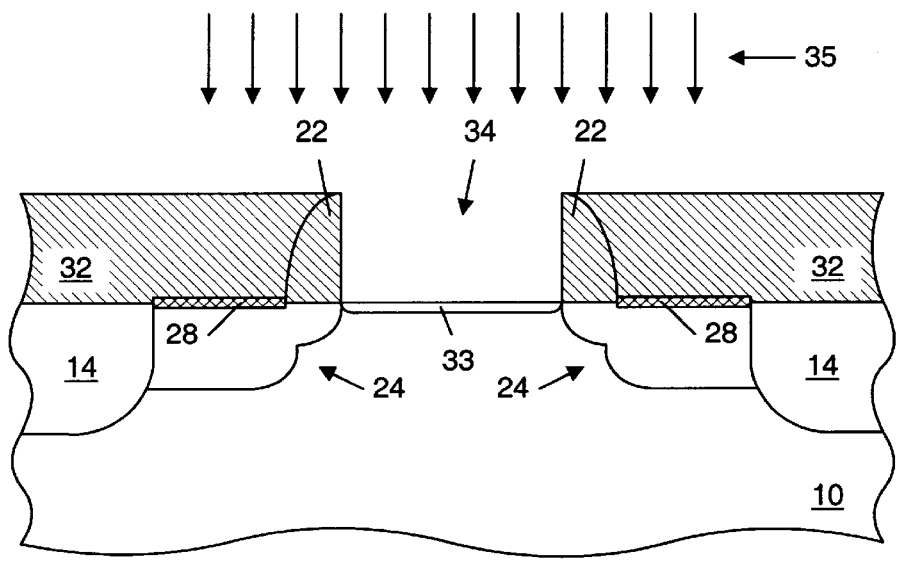
FIG. 7 is a partial cross-sectional view of a semiconductor topography wherein the sacrificial gate structure is removed to form a trench and threshold adjust impurities are introduced, subsequent to the protective dielectric formation of FIG. 6.

Portions of dielectric layer 30 which extend above the upper surface of sacrificial gate structure 12 are subsequently removed, as shown in FIG. 6. The removal process is preferably preformed using chemical-mechanical polishing (CMP). The remaining portions of dielectric layer 30 form protective dielectrics 32, which have upper surfaces at the same level as the upper surface of gate structure 12. In this manner, all upper surfaces of the semiconductor topography, except for the upper surface of gate structure 12, are protected by protective dielectrics 32. Sacrificial gate structure 12 may subsequently be removed, as shown in FIG. 7. This removal is preferably done using an etching process. For example, in an embodiment for which gate structure 12 is oxide and spacers 22 and dielectrics 32 are nitride or oxynitride, gate structure 12 may be removed by a wet etch in hydrofluoric acid buffered with ammonium fluoride, which is selective to oxide over nitride so that spacers 22 and protective dielectrics 32 are not removed. Dry etch methods or other wet etches may also be suitable. Removal of gate structure 12 forms trench 34, which is bounded by an upper surface of substrate 10 and substantially vertical sidewalls of spacers 22.

Threshold adjust impurities may be introduced into the channel region after formation of trench 34, using impurity introduction process 35. Impurity introduction 35 is preferably an ion implantation process. Alternatively, threshold adjust impurity introduction 35 may be performed subsequent to the gate dielectric formation of FIG. 8 below. Threshold adjust distribution 33 results from impurity introduction 35. In the case of n-channel enhancement-mode transistors, threshold adjust distribution 33 is typically p-type, but distribution 33 may be either n-type or p-type, depending on the specific threshold voltage change desired. In the embodiment of FIG. 7, threshold adjust distribution 33 is shallow compared to source and drain distributions 24. Alternatively, distribution 33 may extend farther into the substrate if, for example, a greater energy is used in ion implantation process 35. Threshold adjust distribution 33 differs from conventional threshold adjust implants in that it is confined to the channel region of the transistor. In conventional self-aligned transistor fabrication processes, a threshold adjust implant is typically performed over the entire active area of the substrate, before gate conductor formation. The ability to confine the threshold adjust impurity distribution to the channel region may be advantageous in that the threshold adjust impurities are not placed into the source and drain regions. This may help prevent compensation of the source/drain impurities, since, for example n-channel transistors have n-type source/drain regions but often require p-type threshold adjust implants. Compensation can cause reduction of carrier mobility an increased resistance of the source/drain regions. In addition, introduction of threshold adjust distribution 33 later in the transistor fabrication process may allow more accurate location of the impurities, since the high-temperature source/drain formation processes which may cause impurity diffusion are completed before the formation of trench 34.

Figure 8:
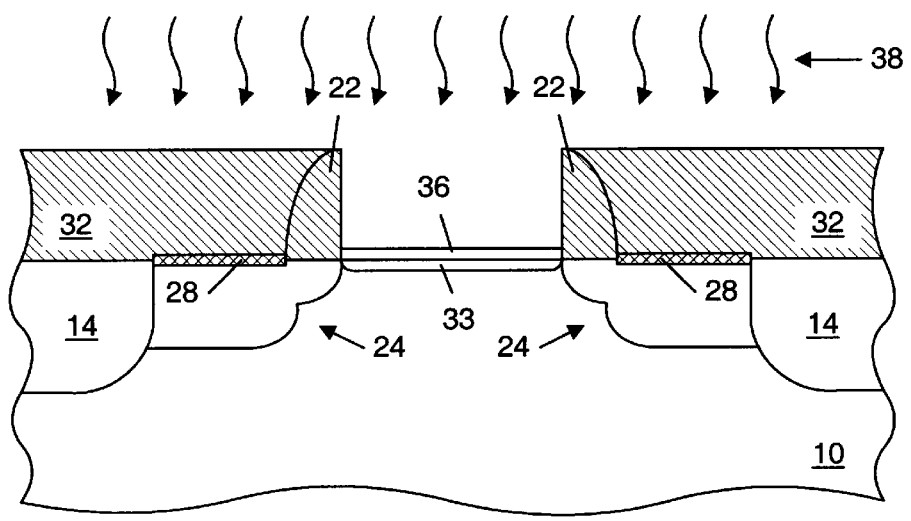
FIG. 8 is a partial cross-sectional view of the semiconductor topography wherein a gate dielectric is formed on the floor of the trench, subsequent to the trench formation of FIG. 7.
Figure 9:
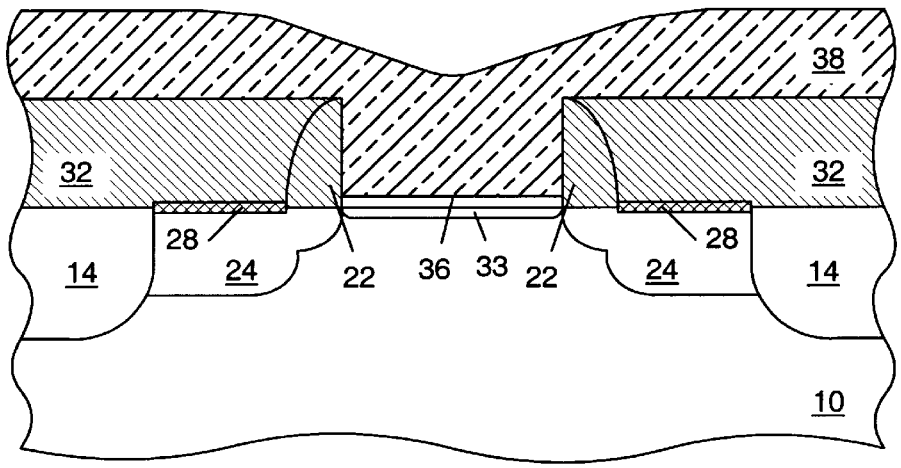
FIG. 9 is a partial cross-sectional view of the semiconductor topography wherein a conductive layer is deposited to fill the trench, subsequent to the gate dielectric formation of FIG. 8.

Gate dielectric 36 is subsequently formed on the floor of trench 34, as shown in FIG. 8. Gate dielectric 36 may be grown using thermal process 38, in which substrate 10 is heated to a temperature of at least 700° C. in an oxidizing ambient. Alternatively, gate dielectric 36 may be deposited using a CVD technique. Dielectrics which may be used for gate dielectric 36 include oxide, nitride, oxynitride and/or combinations of these. Turning now to FIG. 9, conductive layer 38 is deposited over gate dielectric 36 and protective dielectrics 32, such that trench 34 is filled. Conductive layer 38 is preferably formed using a low-resistivity metal such as copper or aluminum, or a metal alloy which demonstrates high conductivity. Copper may be particularly advantageous because of its extremely low resistivity, and its compatibility with copper interconnect processes. Because source and drain impurity distributions 24 are formed prior to deposition of conductive layer 38, conductive layer 38 is believed not to undergo high temperatures during subsequent processing. It is therefore believed to be not necessary for conductive layer 38 to be capable of withstanding high temperatures. In an embodiment for which conductive layer 38 is formed from copper, gate dielectric 36 is preferably silicon nitride, because silicon nitride is believed to be more effective than silicon dioxide in blocking diffusion of copper atoms from their deposited positions. Deposition of copper or other metals for conductive layer 38 may include deposition of an adhesion promoting layer and/or deposition of a diffusion barrier layer. Titanium nitride, for example, may be a suitable material for both adhesion promotion and diffusion blocking. Titanium nitride may be deposited by methods including evaporation or sputtering of titanium in a nitrogen ambient, sputtering of titanium nitride, and thermal nitridation of sputtered titanium. Copper deposition may also include formation of a thin seed layer of copper by physical vapor deposition (PVD) techniques such as evaporation or sputtering, or by CVD. Deposition of thicker copper layers may include CVD, PVD and plating techniques.

Figure 10:
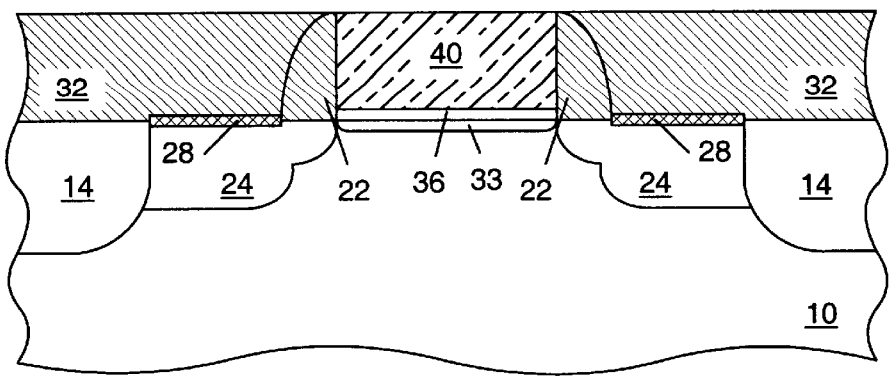
FIG. 10 is a partial cross-sectional view of the semiconductor topography wherein portions of the conductive layer external to the trench are removed, subsequent to the deposition of FIG. 9.

Portions of conductive layer 38 which extend above the upper surfaces of dielectrics 32 are subsequently removed, as shown in FIG. 10. The removal is preferably done using CMP, and the remaining portion of conductive layer 38 forms conductive gate region 40. The resulting transistor may contain a low-resistance gate which is self-aligned to source and drain impurity distributions 24. Openings in dielectrics 32 may subsequently be formed by conventional lithography and etching techniques so that contact may be made to the source and drain regions, and further dielectric and conductor depositions may be used for interconnect formation by methods well-known in the art. In embodiments for which dielectrics 32 are formed from nitride, it may be desirable to remove the dielectrics and replace them with an oxide interlevel dielectric prior to interconnect formation. In this way, excessive capacitive coupling between the transistor and overlying interconnect conductors caused by the higher dielectric constant of nitride may be avoided.

Figure 11:
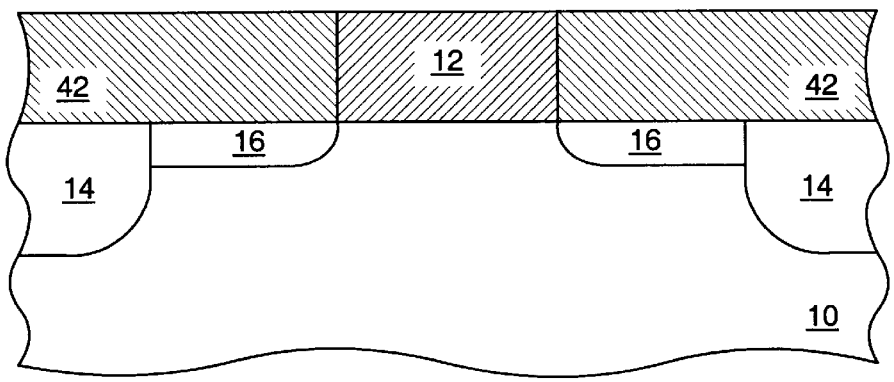
FIG. 11 is a partial cross-sectional view of a semiconductor topography according to an alternative embodiment, wherein no dielectric spacers are formed, no additional impurities are introduced, and no suicides arc formed prior to protective dielectric formation as in FIGS. 5–6, subsequent to the impurity introduction of FIG. 1.
Figure 12:
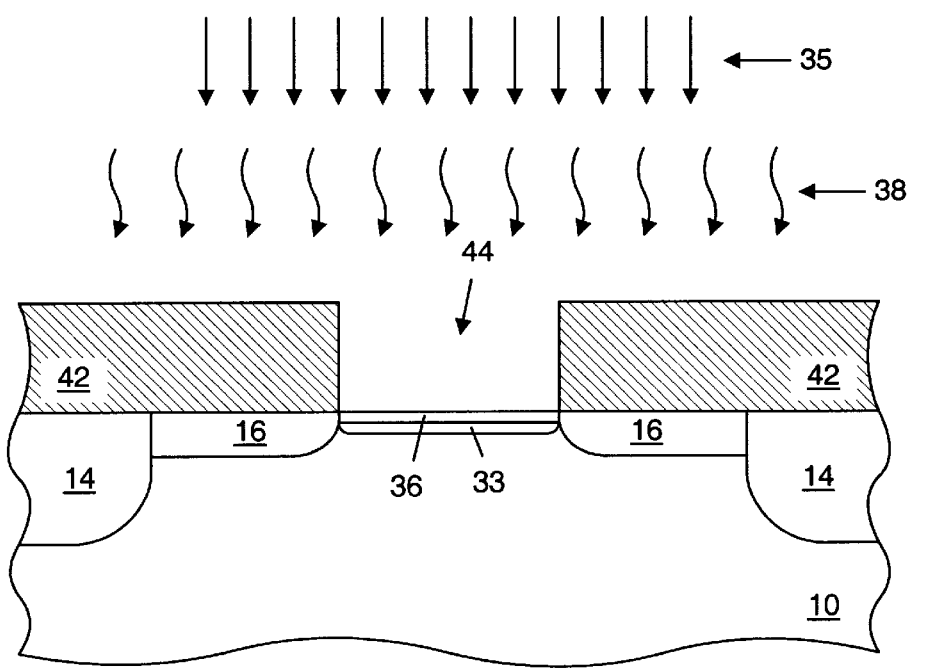
FIG. 12 is a partial cross-sectional view of the semiconductor topography wherein the sacrificial gate structure is removed to form a trench, threshold adjust impurities are introduced, and a gate dielectric is formed on the floor of the trench, subsequent to the protective dielectric formation of FIG. 11.

Turning now to FIG. 11, a partial cross section of a semiconductor topography according to an alternative embodiment is shown. In the embodiment of FIG. 11, no spacers are formed, no second impurity distribution is introduced, and no silicides are formed before forming protective dielectrics upon the topography shown in FIG. 1. Protective dielectrics 42, formed in a similar manner to protective dielectrics 32 as shown in FIGS. 5 and 6, are therefore adjacent to sacrificial gate structure 12. As in the case of dielectrics 32, dielectrics 42 are formed from a different dielectric than gate structure 12, so that gate structure 12 may be removed to form trench 44, as shown in FIG. 12, while dielectrics 42 are left intact. Threshold adjust impurities may be introduced into the channel region after formation of trench 44, using impurity introduction process 35, as also shown in FIG. 7. Threshold adjust impurity introduction 35 may be performed before or after formation of gate dielectric 36. Threshold adjust distribution 33, as also shown in FIG. 7, results from impurity introduction 35.

Figure 13:
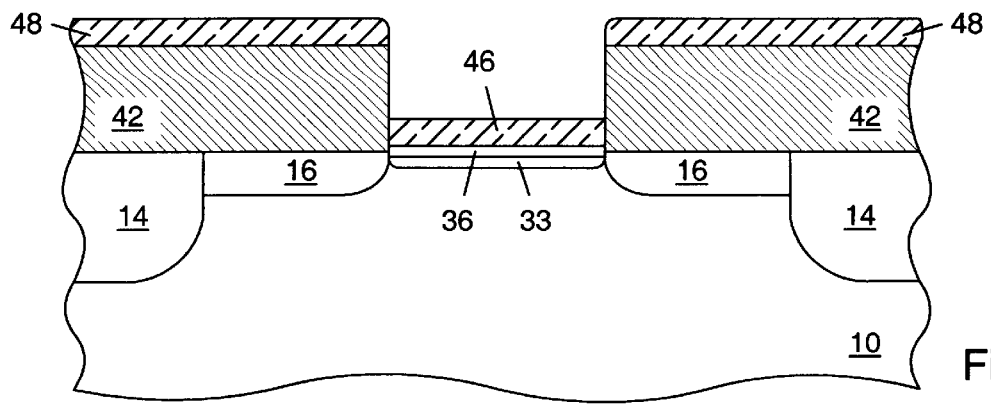
FIG. 13 is a partial cross-sectional view of the semiconductor topography wherein a conductive layer is deposited upon the gate dielectric and protective dielectrics, subsequent to the gate dielectric formation of FIG. 12.

Gate dielectric 36 is formed on the floor of trench 40, preferably using thermal process 38, as also shown in FIG. 8. A conductive layer may then be formed such that conductive layer portion 46 partially fills trench 44 and portions 48 are formed over dielectrics 42, as shown in FIG. 13. The composition of conductive layer portions 46 and 48 is similar to that of conductive layer 38, which is discussed above in the description of FIG. 9. In the embodiment of FIG. 13, conductive layer portions 46 and 48 are deposited using a non-conformal technique such as sputtering. This results in a uniform thickness of conductive layer portion 46 without deposition on the sidewalls of trench 44. Alternatively, conformal methods such as CVD may be used for deposition of conductive layer portions 46 and 48.

Figure 14:
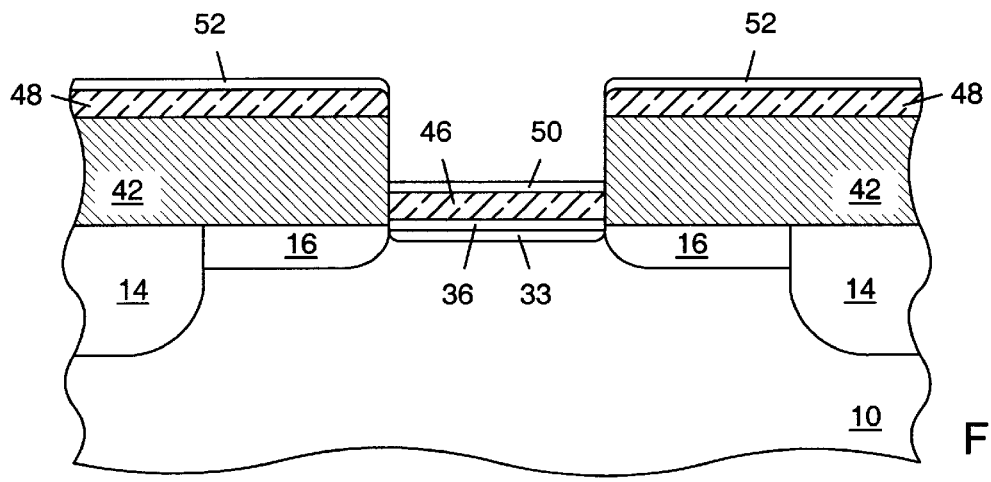
FIG. 14 is a partial cross-sectional view of the semiconductor topography wherein a second gate electric is formed upon the conductive layer, subsequent to the conductive layer deposition of FIG. 13.
Figure 15:
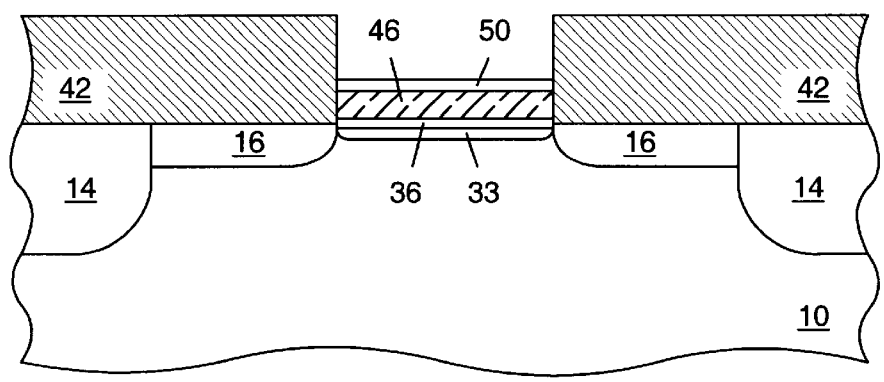
FIG. 15 is a partial cross-sectional view of the semiconductor topography wherein portions of the conductive layer and gate dielectrics external to the trench are removed, subsequent to the second gate dielectric formation of FIG. 14.

A second gate dielectric may subsequently be deposited, such that gate dielectric portion 50 is formed over conductive layer portion 46 and gate dielectric portions 52 arc formed over conductive layer portions 48, as shown in FIG. 14. The composition of gate dielectric portions 50 and 52 is similar to that of gate dielectric 36, discussed in the description of FIG. 8 above. In embodiments for which conductive layer portions 46 and 48 are metal, gate dielectric portions 50 and 52 must be deposited, rather than grown using a thermal process such as thermal process 38 of FIG. 8. In the embodiment of FIG. 14, gate dielectric portions 50 and 52 are deposited using a non-conformal technique such as sputtering. Alternatively, a conformal deposition technique such as CVD may be used. Portions 48 and 52 of the conductive and gate dielectric layers which are external to trench 44 may subsequently be removed, as shown in FIG. 15. This removal is preferably accomplished using CMP.

Figure 16:
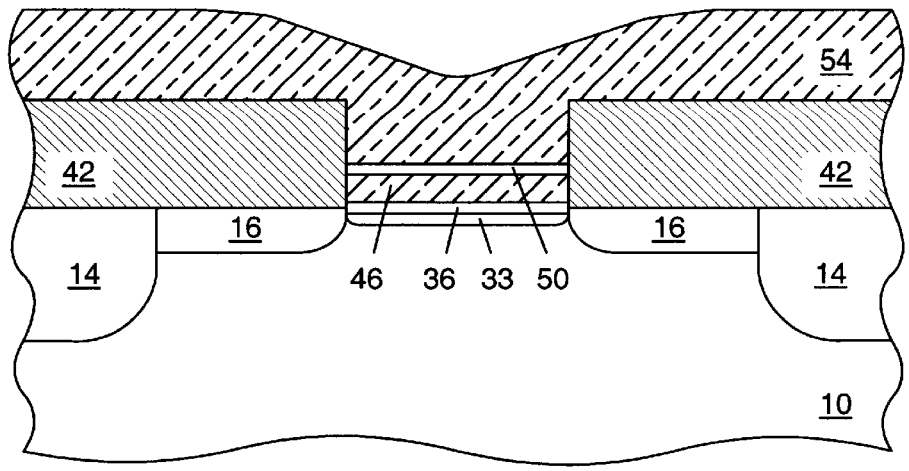
FIG. 16 is a partial cross-sectional view of the semiconductor topography wherein a second conductive layer is deposited to fill the trench, subsequent to the layer portion removal of FIG. 15.
Figure 17:
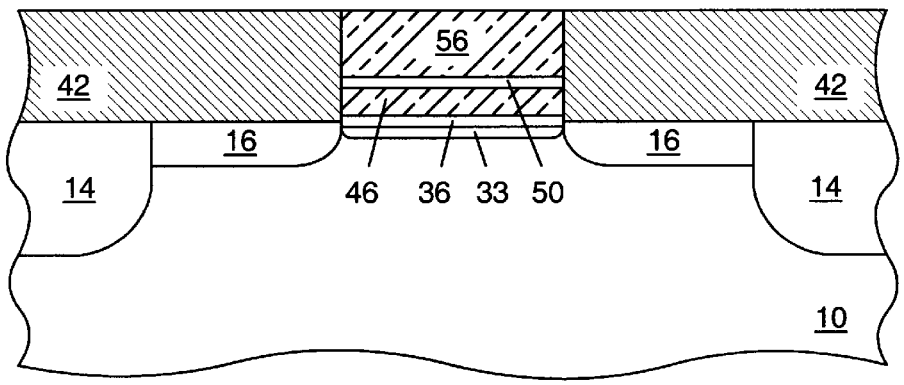
FIG. 17 is a partial cross-sectional view of the semiconductor topography wherein portions of the second conductive layer external to the trench are removed, subsequent to the second conductive layer formation of FIG. 16.

Conductive layer 54 may subsequently be deposited over gate dielectric portion 50 and dielectrics 42, such that trench 44 is filled, as shown in FIG. 16. The composition of conductive layer 54 is preferably similar to that of conductive layers 38 and 46, shown in FIGS. 9 and 13, respectively. Portions of conductive layer 54 which extend above the upper surfaces of dielectrics 42 are subsequently removed such that conductive gate 56 is formed, as shown in FIG. 17. The resulting device is a dual gate structure, which may be useful, for example, as a memory cell. Conductive portion 46, for example, may serve as a floating gate, and conductive gate 56 may function as a control gate or select gate for a cell in a flash electrically-erasable programmable read-only memory (EEPROM) device. The use of copper for conductive gates 46 and 56 may be advantageous because of a higher electron storage capacity for copper as compared to polysilicon and to other metals. This may allow a memory cell using copper gates to have a smaller area than a conventional memory cell which handles the same amount of charge. In an embodiment having conductive gates 46 and 56 formed from copper, it may be advantageous for gate dielectrics 36 and 50 to be silicon nitride. Silicon nitride is believed to form a superior diffusion barrier to copper as compared to silicon dioxide. The use of copper to form metal gates 46 and 56 may include the deposition of adhesion and/or diffusion barrier layers, and CVD, PVD and/or plating of copper, as described for metal layer 38 shown in FIG. 8.

Figure 18:
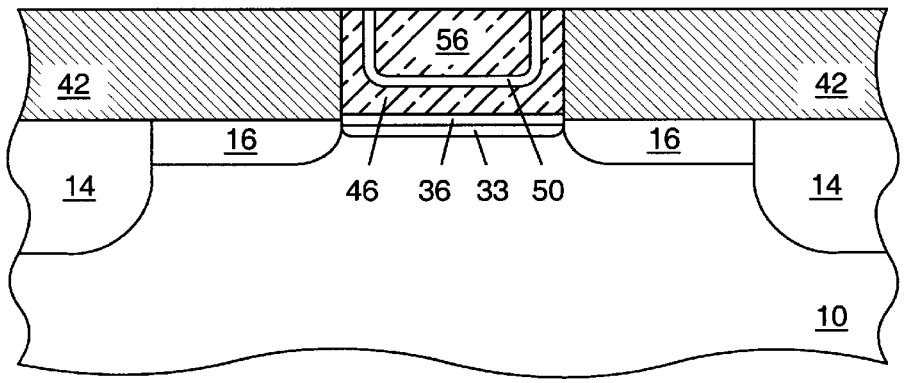
FIG. 18 is a partial cross-sectional view of the semiconductor topography according to an alternate embodiment, wherein the conductive layers and second dielectric layer are deposited using conformal techniques, subsequent to the gate dielectric formation of FIG. 12.

In an alternative embodiment, the CMP process of FIG. 15 may be omitted until after deposition of conductive layer 54. Removal of layers external to the trench before deposition of conductive layer 54, however, is believed to make void-free filling of the remainder of trench 44 easier. In another embodiment, conductive gate 56 may be formed from doped polysilicon. This may be advantageous in some cases for integration of the resulting memory cell with conventional polysilicon-gate transistor circuits. Formation of gate 56 from polysilicon typically involves deposition of a polysilicon layer for conductive layer 54 by CVD using a silane source. In an alternative embodiment shown in FIG. 18, conductive gates 46 and 56 and gate dielectric 50 are formed using conformal deposition techniques. Because conformal deposition methods result in deposition on the sidewalls of the trench, it is believed that this gate dielectric and these gates have U-shaped cross-sections, as shown in FIG. 18. The resulting device is a dual-gate structure which may be usable as a memory cell in a similar manner as the device shown in FIG. 17. Other combinations of conformal and non-conformal deposition methods may also be used, such as non-conformal deposition of conductive gate 46 and conformal deposition of gate dielectric 50 and conductive gate 56.

It will be appreciated to those skilled in the art having the benefit of this disclosure that this invention is believed to provide a method for forming self-aligned low-resistance gate structures for semiconductor devices using a sacrificial dielectric gate structure. Further modifications and alternative embodiments of various aspects of the invention will be apparent to those skilled in the art in view of this description. For example, all embodiments of the method and device recited herein may be realized with or without dielectric spacers such as spacers 22 shown in FIG. 3. It is intended that the following claims be interpreted to embrace all such modifications and changes and, accordingly, the specification and drawings are to be regarded in an illustrative rather than a restrictive sense.

What is claimed is:

1. A method for forming a semiconductor device, comprising:

forming a dielectric sacrificial gate structure upon a semiconductor substrate;

introducing first impurity distributions into the semiconductor substrate using the sacrificial gate structure as a mask, wherein the impurity distributions are of opposite type than the semiconductor substrate;

forming dielectric spacers adjacent opposed sidewall surfaces of the sacrificial gate structure, wherein the dielectric spacers comprise a different chemical composition than the sacrificial gate structure;

introducing second impurity distributions into the semiconductor substrate using the sacrificial gate structure and dielectric spacers as a mask, wherein the second impurity distributions are of the same type as the first impurity distributions, and wherein the second impurity distributions are more heavily doped and extend further into the substrate than the first impurity distributions;

forming silicide regions upon the semiconductor substrate and exclusive of the dielectric spacers forming protective dielectrics above the semiconductor substrate to an elevation level commensurate with an upper surface of the sacrificial gate structure, wherein the protective dielectrics comprise a different chemical composition than the sacrificial gate structure;

removing the sacrificial gate structure to form a trench;

introducing dopants into a portion of the semiconductor substrate exposed by formation of the trench; and filling at least a portion of the trench with a conductive material.

2. The method as recited in claim 1, wherein said forming protective dielectrics comprises:

depositing a conformal dielectric layer over said sacrificial gate structure and said semiconductor substrate, wherein a thickness of said dielectric layer is greater than a thickness of said sacrificial gate structure; and removing an upper portion of said dielectric layer, wherein a lower surface of said upper portion is co-planar with the upper surface of the sacrificial gate structure.

3. The method as recited in claim 2, wherein said forming the sacrificial dielectric gate structure comprises patterning a deposited oxide layer, and wherein said depositing the conformal dielectric layer comprises depositing nitride or oxynitride.

4. The method as recited in claim 2, wherein said forming the sacrificial dielectric gate structure comprises patterning a deposited nitride or oxynitride layer, and wherein said depositing the conformal dielectric layer comprises depositing oxide.

5. The method as recited in claim 1, wherein said filling comprises:

depositing a conductive layer within said trench and over said protective dielectrics; and removing portions of the conductive layer external to said trench.

6. The method as recited in claim 5, wherein said depositing a conductive layer comprises depositing copper or a copper alloy.

7. The method as recited in claim 5, wherein said depositing a conductive layer comprises depositing aluminum.

8. The method as recited in claim 5, wherein said filling further comprises forming a gate dielectric on a floor of the trench, prior to said depositing a conductive layer, and wherein said removing portions further comprises removing any portions of the gate dielectric external to the trench.

9. The method as recited in claim 8, wherein said introducing comprises implanting a threshold adjust impurity distribution into a portion of the semiconductor substrate underlying the trench, prior to said depositing a conductive layer.

10. The method as recited in claim 8, wherein said filling further comprises:

forming a second gate dielectric within the trench and above the conductive layer, prior to said removing portions; and forming a second conductive layer within the trench and above the second gate dielectric, prior to said removing portions, wherein said removing portions further comprises removing portions of the second gate dielectric and the second conductive layer external to the trench.

11. The method as recited in claim 1, wherein said forming the dielectric sacrificial gate structure comprises:

chemical vapor depositing a dielectric layer over the semiconductor substrate;

depositing a photoresist layer over the dielectric layer;

exposing the photoresist layer through a mask and developing the photoresist layer to form a patterned photoresist structure;

anisotropically etching exposed portions of the dielectric layer to form the sacrificial gate structure; and removing the patterned photoresist structure.

12. The method as recited in claim 11, wherein said chemical vapor depositing comprises using a silane source.

13. The method as recited in claim 2, wherein said depositing the conformal dielectric comprises chemical vapor depositing using a tetraethyl orthosilicate (TEOS) source.

14. The method as recited in claim 8, wherein said forming the gate dielectric comprises heating the trench to a temperature higher than about 700° C. in an ambient comprising a chemical selected from the group consisting of oxygen and nitrogen.

15. The method as recited in claim 10, wherein said forming the second gate dielectric comprises chemical vapor depositing of a layer comprising a material selected from the group consisting of oxide, nitride, and oxynitride.

16. The method as recited in claim 1, wherein said removing the sacrificial gate structure comprises wet etching.

17. A method for forming a semiconductor device, comprising:

forming a dielectric sacrificial gate structure upon a semiconductor substrate;

forming protective dielectrics above the semiconductor substrate to an elevation level commensurate with an upper surface of the sacrificial gate structure, wherein the protective dielectrics comprise a different chemical composition than the sacrificial gate structure;

removing the sacrificial gate structure to form a trench;

introducing dopants into a portion of the semiconductor substrate exposed by formation of the trench;

forming a gate dielectric on a floor of the trench;

depositing a conductive layer within said trench and over said gate dielectric;

forming a second gate dielectric within the trench and above the conductive layer;

depositing a second conductive layer within the trench and above the second gate dielectric; and removing portions of said gate dielectric, said conductive layer, said second gate dielectric and said second conductive layer external to the trench.

18. The method as recited in claim 17, wherein said forming the sacrificial gate structure comprises forming dielectric spacers adjacent opposed sidewall surfaces of the sacrificial gate structure, and wherein the dielectric spacers comprise a different chemical composition than the sacrificial gate structure.

19. The method as recited in claim 18, further comprising:

introducing first impurity distributions into the semiconductor substrate using the sacrificial gate structure as a mask, wherein the impurity distributions are of opposite type than the semiconductor substrate, prior to said forming dielectric spacers;

introducing second impurity distributions into the semiconductor substrate using the sacrificial gate structure and dielectric spacers as a mask, prior to said forming protective dielectrics, wherein the second impurity distributions are of the same type as the first impurity distributions, and wherein the second impurity distributions are more heavily doped and extend further into the substrate than the first impurity distributions; and forming silicide regions upon the semiconductor substrate and exclusive of the dielectric spacers, prior to said forming protective dielectrics.

20. The method as recited in claim 17, wherein said introducing comprises implanting a threshold adjust impurity distribution into a portion of the semiconductor substrate underlying the trench, prior to said forming a gate dielectric.

* * * * *